(12) United States Patent
Ramirez

(10) Patent No.: US 6,977,494 B2
(45) Date of Patent: Dec. 20, 2005

(54) SWITCHABLE IMPEDANCE CIRCUIT FOR CURRENT SENSING AN ELECTRICITY METER

(75) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 20 days.

(21) Appl. No.: 10/662,090

(22) Filed: Sep. 12, 2003

(65) Prior Publication Data

US 2004/0061489 A1 Apr. 1, 2004

Related U.S. Application Data

(60) Provisional application No. 60/410,241, filed on Sep. 12, 2002.

(51) Int. Cl.[7] ............................ G01R 7/00; G01R 11/32
(52) U.S. Cl. ............... 324/117 R; 324/142; 324/158.1; 702/121
(58) Field of Search ............................. 324/750–765, 324/117 R, 127, 141, 142

(56) References Cited

U.S. PATENT DOCUMENTS

| | | |
|---|---|---|
| 4,373,189 A | 2/1983 | Weant |
| 4,596,951 A * | 6/1986 | Heinrich et al. ............ 324/142 |
| 4,876,502 A | 10/1989 | Verbanets et al. |
| 5,646,520 A * | 7/1997 | Frank et al. .............. 324/158.1 |

FOREIGN PATENT DOCUMENTS

JP 2000-187987 * 4/2000 ......... G11C 11/417

* cited by examiner

*Primary Examiner*—Vinh Nguyen
*Assistant Examiner*—Emily Y Chan
(74) *Attorney, Agent, or Firm*—Maginot, Moore & Beck

(57) ABSTRACT

An arrangement for generating a digital current measurement signal includes an analog-to-digital (A/D) converter and an impedance circuit. The A/D converter is operable to receive a voltage input signal and generate a digital output signal having a digital value representative of the magnitude of the voltage input signal. The impedance circuit includes at least first and second alternative impedance values and a switch operable to cause the impedance circuit to have a select one of the first impedance value and the second impedance value. The impedance circuit is configured to receive a current signal to be digitized, the impedance circuit generating an output voltage signal representative of the current signal and having a magnitude dependent on the select one of the first impedance value and the second impedance value. The output voltage signal of the impedance circuit is then provided as the voltage input signal of the A/D converter.

15 Claims, 5 Drawing Sheets

SWITCHABLE IMPEDANCE CIRCUIT FOR CURRENT SENSING AN ELECTRICITY METER

This application claims the benefit of the filing date of U.S. Provisional Application Ser. No. 60/410,241 entitled Low Cost Active Attenuator for Current Sensing Application filed on Sep. 12, 2002 for all matter disclosed therein.

FIELD OF THE INVENTION

This invention relates generally to electricity meters and more particularly to impedance circuits for current sensor circuitry in electricity meters.

BACKGROUND OF THE INVENTION

Electricity meters measure electrical energy consumed by a facility. Electrical utility service providers, or simply utilities, employ electricity meters to gather energy consumption data for customer billing and other purposes. Common forms of electricity meters are electronic-based meters and electromechanical meters. Electromechanical meters employ rotating disks driven by electromagnetic fields in order to detect energy usage. By contrast, an electronic meter measures electrical energy consumption by sampling scaled-down versions of the voltage and current waveforms on the power lines of a facility and the performing energy consumption calculations using the sampled waveforms.

More specifically, electronic meters employ sensors that "scale down" the voltage and current waveforms to generate representative measurement signals. The measurement signals are then passed one or more A/D converters that sample the measurement signal to generate the "digital" voltage and current waveforms (i.e. series of digital samples). A processing circuit then performs mathematic operations on the digital voltage and current waveforms to calculate electrical energy consumption.

Electricity meters must have the ability to accurately measure currents over a broad dynamic range. While the RMS line voltage seldom varies, the RMS line current can change significantly as energy consumption by the customer changes. As a consequence, a meter must accurately measure as little as 1 Amp RMS and as much as 225 Amps RMS. This requires that the A/D converter be accurate over that same range.

This Accuracy requirement presents a problem because A/D converters inherently have less resolution when measuring quantities that are small with respect to the AID converter's range. For example, if an A/D converter having 256 discrete levels measures from 0 to 225 amps, then a small current, for example two amps RMS, will be represented by only 2 or 3 of the available discrete quantization levels. As a consequence, the digitized waveform will not have adequate resolution. By contrast, a 200 amp current waveform in the same A/D converter will be represented by well over 200 discrete quantization levels, thereby providing a fairly smooth and accurate representation of the waveform. Thus, it is difficult to obtain accurate digital representations over a broad range of current magnitudes.

Moreover, the inherent inaccuracies that exist in many A/D converters can be exaggerated when attempting to digitize signals having a peak value that is well below the effective scale of the converter. One such inherent inaccuracy of A/D converters is quantization step error. A quantization error in a converter that causes a relatively insignificant error when digitizing large input signals can cause a relatively substantial error when digitizing very small input signals.

As a consequence, to ensure accuracy over the entire dynamic range of current levels in an electricity meter, the A/D converter must be chosen such that it is highly accurate at low RMS current levels as well as at high RMS current levels. To this end, an A/D converter may include sufficient quantization step levels such that even very low current waveforms cover a number of quantization levels. Thus, it may be necessary to use an extremely high resolution A/D converter in order to ensure accuracy at low level currents. Unfortunately, increasing the number of the quantization levels of the A/D converter adds cost.

Moreover, because the excess quantization levels are not necessary at medium and high RMS current levels, the additional cost is not always justified. Nevertheless, the meter must satisfy industry and government accuracy standards over its entire useful range, including the low RMS current range.

There is a need, therefore, for an electricity meter that performs energy calculations uses digital signals, achieves accuracy over a wide range of currents, and does not suffer the cost disadvantages due to increase accuracy requirements in the A/D converter.

SUMMARY OF THE INVENTION

The present invention addresses the above need, as well as others, by providing an arrangement for digitizing current signals that includes a current sensing impedance circuit that may be adjusted to provide different current sensing impedance in response to the magnitude of the input current. In a preferred embodiment, the current sensing impedance circuit provides different current sensing impedance levels without adding costly components or processes.

A first embodiment of the invention is an arrangement for generating a digital current measurement signal that includes an analog-to-digital (A/D) converter and an impedance circuit. The A/D converter is operable to receive a voltage input signal and generate a digital output signal having a digital value representative of the magnitude of the voltage input signal. The impedance circuit includes at least first and second alternative impedance values and a switch operable to cause the impedance circuit to have a select one of the first impedance value and the second impedance value. The impedance circuit is configured to receive a current signal to be digitized, the impedance circuit generating an output voltage signal representative of the current signal and having a magnitude dependent on the select one of the first impedance value and the second impedance value. The output voltage signal of the impedance circuit is then provided as the voltage input signal of the A/D converter.

A second embodiment of the invention is an impedance circuit configured to be connected to receive a current to be converted to a voltage. The impedance circuit includes a first output resistor and a second parallel output resistor, the second parallel output resistor connected to a switch that is operable to selectively connect and disconnect the second parallel output resistor.

Additional features and advantages of the present invention will become apparent to those skilled in the art upon consideration of the following detailed description of preferred embodiments exemplifying the best mode of carrying out the invention as presently perceived.

BRIEF DESCRIPTION OF THE DRAWINGS

The illustrative device will be described hereinafter with reference to the attached drawings which are given as non-limiting examples only, in which.

DETAILED DESCRIPTION OF THE DRAWINGS

Figure 1:
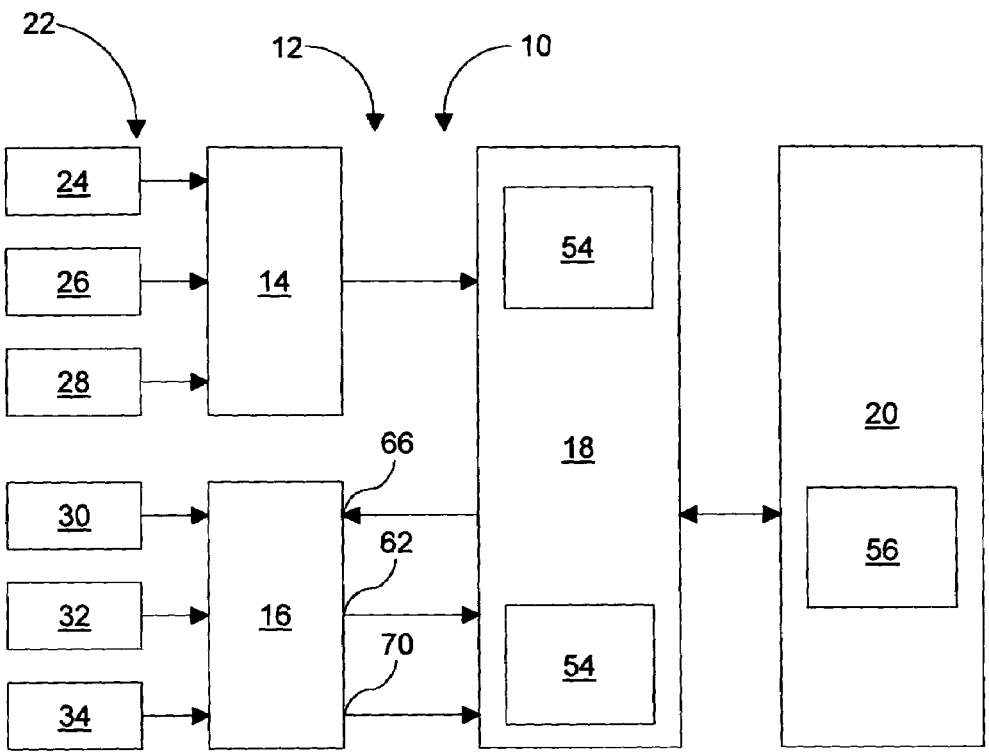
FIG. 1 is a block diagram of a data acquisition interface in a poly-phase solid state electricity meter showing voltage sensors and current sensors for a three phase service communicating with a data acquisition subsystem in communication with a data processing and communications subsystem.

As shown, for example, in FIG. 1 an electricity meter 10 includes a data acquisition interface 12. The data acquisition interface 12 is from a poly-phase solid state electricity meter 10, such as a Siemens' S4 electricity meter. Illustratively, the electricity meter 10 is metering power consumption from a three phase electrical service 22. The data acquisition interface 12 includes voltage sensors 14, current sensors 16, a data acquisition subsystem 18 and a data processing and communication subsystem 20.

Power line voltage sensors 14 are devices that are configured to sense the potential between ground and each conductor of a three phase electrical service 22. This is represented diagrammatically by Phase A voltage 24, Phase B voltage 26 and Phase C voltage 28 being coupled to voltage sensors 14.

The voltage sensors 14 typically generate voltage measurement signals in the form of analog waveforms that are representative of the voltage waveform in each phase power line. Thus, one of the voltage sensors 14 generates a voltage measurement signal that is representative of the phase A voltage waveform, another of the voltage sensors 14 generates a voltage measurement signal that is representative of the phase B voltage waveform, and another of the voltage sensors 14 generates a voltage measurement signal that is representative of the phase C voltage waveform.

Many line voltage measurement devices and circuits that operate in the above-described manner are well known in the art. For example, the line voltage sensor 14 may suitably include a direct connection to the power lines, a voltage transformer, a voltage divider, or any combination of the above.

Current sensors 16 are devices that are configured to sense the current carried in each conductor of the three phase service 22. This is represented diagrammatically by Phase A current 30, Phase B current 32, and Phase C current 34 being coupled to current sensors 16. Similar to the voltage sensors, the current sensors 16 generate a current measurement signal that is representative of the current waveform on each of the phase of the three phase service.

The electricity metering system obtains, through power line voltage sensors 14 (line voltages phases A, B and C, 24, 26 and 28, respectively) and current sensors 16 (line currents phase A, B and C, 30, 32, 34, respectively), analog measurement signals that constitute accurate representations of the power line service being metered. As will be discussed below, the analog measurement signals are sampled to provide a digital version the measurement signals. Metering calculations may then be performed by digital processors using the digital measurement signals.

To this end, the analog voltage and current measurement signals are processed by the data acquisition subsystem 18 and passed to the data processing and communication subsystem 20. Data acquisition subsystem 18 includes one or more analog to digital converters 54 that sample the digital and current measurement signals. The digital voltage and current data is processed by a processing circuit 56 to generate the metering information.

The processing circuit 56 may include a digital signal processor or a high speed microprocessor, or a combination of these and/or other processing devise. Many processing circuits that can generate a variety of electricity metering information from digital voltage and current measurement signals are known in the art, and include those shown in U.S. Pat. No. 6,112,158 to Bond et al., and U.S. Pat. No. 5,544,089 to Hemminger et al., both of which are incorporated herein by reference.

Under normal circumstances, the current sensors 16 and data acquisition subsystem 18 may be required to measure and sample alternating currents of between 1 amp and 225 or more amps. In accordance with the present invention, each of the current sensors 16 and data acquisition subsystem 18 cooperate to obtain quality digital representations of the current waveform throughout the wide range of currents.

Figure 2:
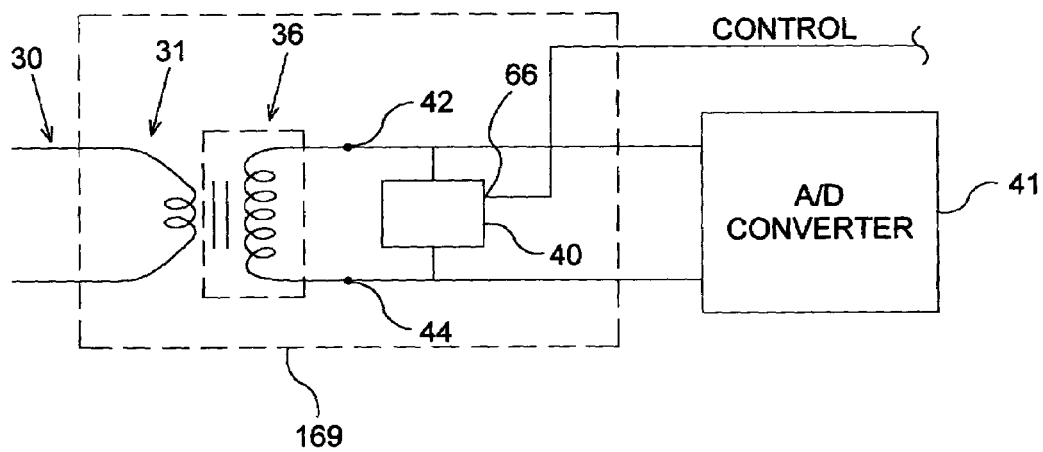
FIG. 2 is a block diagram of a current sensor and an A/D converter of the meter of FIG. 1.

FIG. 2 shows in further detail an exemplary embodiment of a first current sensor 16a of the current sensors 16 of FIG. 1, and an A/D converter 41 of the data acquisition subsystem 18. The first current sensor 16a is configured to obtain a phase A voltage measurement signal. It will be appreciated that in some embodiments, the data acquisition subsystem 18 may include a multiplexer or other switch interposed between the current sensor 16a and the A/D converter. The multiplexer does not affect the operation of the current sensor 16a, but allows the A/D converter 41 to sample multiple signals, including signals other than the one provided by the first current sensor 16a.

In any event, the current sensor 16a includes a current transformer 36 and a sensing impedance circuit 40. The current transformer 36 is configured to obtain a scaled-down version of the phase A current 30. To this end, the current transformer 36 is in a current sensing relationship with the phase A power line conductor 31. In the exemplary embodiment described herein, the current transformer 36 may suitably be in the form of toroid having a center opening through which the phase A power line conductor 31 passes.

The A/D converter 41 is a device that is operable to receive an input signal and generate a sequence of samples that are representative of the instantaneous voltage magnitude of the input signal. Each of the samples is preferably a N-bit digital word. The A/D converter may suitably be a successive-approximation type converter or a sigma delta type converter.

The sensing impedance circuit 40 is an impedance that is connected across the terminals 42, 44 of the current transformer 36. The sensing impedance circuit 40 effectively translates the current waveform generated by the current transformer 36 into a voltage waveform that may be digitized by the A/D converter 41.

More specifically, the sensing impedance circuit 40 has at least first and second alternative impedance values and a switch operable to cause the impedance circuit 40 to have a select one of those values. When the phase A current is relatively high, the switch causes the sensing impedance circuit 40 to have a lower impedance, and when the phase A current is relatively low, the switch causes the sensing impedance circuit to have a higher impedance. The lower impedance effectively scales down the signal generated by high input currents, while the higher impedance effectively boosts the signal generated by low input currents. The sensing impedance circuit 40 thus effectively boosts low currents so that they tend to span a larger portion of the dynamic range of the A/D converter 41.

Preferably, the sensing impedance circuit 40 does not employ active signal amplification on the input signal (i.e. it is a passive impedance circuit). The use of passive components reduces component costs and may reduce the calibration requirements of the current sensor 16a. Exemplary embodiments of the sensing impedance circuit 40 are described in further detail below in connection with FIGS. 3, 4, 5 and 6.

The sensing impedance circuit 40 also includes a control input 66. The control input 66 is preferably coupled to a source of control signals, not shown in FIG. 2, that select one of the first impedance value and the second impedance value of the sensing impedance circuit 40. The source of control signals may suitably be the processing circuit 56 of FIG. 1.

In general operation of the circuit of FIG. 2, the electricity flowing the load being metered (i.e. the customer) passes through the phase A conductor 31. The current flowing through the phase A conductor 31 is impressed upon the winding of the current transformer 36. The current transformer 36 thus produces a scaled-down version of the phase A current across the sensing impedance circuit 40. The voltage across the sensing impedance circuit 40 constitutes the output current sensor voltage signal, which is representative of the phase A current waveform. The proportion of the current sensor voltage signal to the actual phase A current is one of two ratios, and is defined by the select one of the two impedance values produced by the sensing impedance circuit 40.

If the current is relatively high, then the source of control signals, not shown in FIG. 2, provides a logic high signal which causes the switch within the sensing impedance circuit 40 to cause the sensing impedance circuit 40 to have the lower impedance value. If, however, the current is relatively low, then the source of control signals provides a logic low signal which causes the switch within the sensing impedance circuit 40 to cause the sensing impedance circuit 40 to have the higher impedance value.

Figure 3:
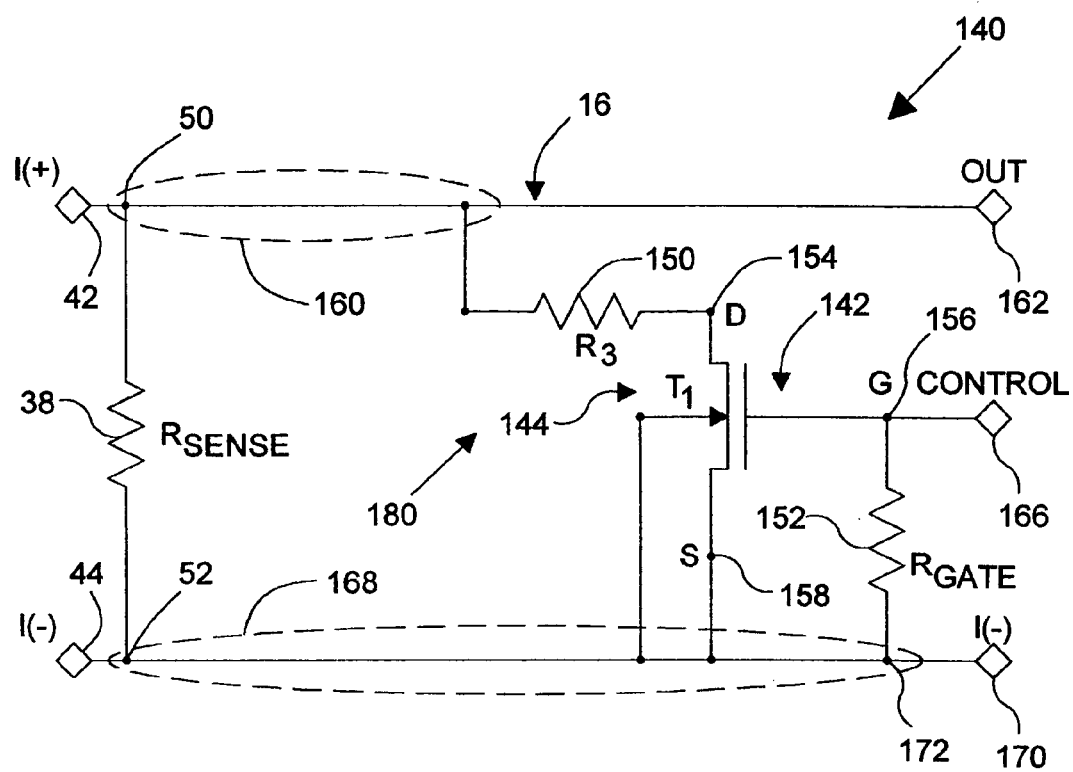
FIG. 3 is a schematic diagram of the sensing resistor and a first embodiment of the sensing impedance circuit of FIG. 2.

A first embodiment 140 of the sensing impedance circuit 40 for a current sensor 16a in accordance with the disclosure is shown, for example, in FIG. 3. The impedance circuit 140 is connected across terminals 42, 44 of current transformer 36. The impedance circuit 140 includes an electrically actuated switch 142, a drain resistor $R_3$ 150, and a gate resistor $R_{gate}$ 152. Illustratively, switch 142 is a Metal-Oxide Semiconductor Field Effect Transistor ("MOSFET") 144. The impedance circuit 140 uses a MOSFET 144 with a low drain to source resistance ($R_{Don}$) value. In the embodiment described herein, the MOSFET 144 has a drain to source resistance when on ($R_{Don}$) of less than 0.01 Ohms ($R_{Don}$<0.01 Ω) at two hundred milliamps (200 mA$_{rms}$). Such MOSFETs are commercially available, and may readily be formed in a silicon substrate using known techniques.

The drain 154 of the MOSFET 144 is coupled through drain resistor $R_3$ 150 to an I(+) node 160. The I(+) node 160 is coupled to the I(+) terminal 50 of a first resistor $R_{sense}$ 38 and the I(+) terminal 42 of the current transformer 36 (see also FIG. 2). The I(+) node 160 is also coupled to an OUT terminal 162 of the impedance circuit 140. The gate 156 of MOSFET 144 is coupled to a first terminal 164 of the gate resistor $R_{gate}$ 152 and to a CONTROL terminal 166 of the impedance circuit 140. The CONTROL terminal 166 is connected to TTL logic circuitry providing a CONTROL signal to gate 156 of MOSFET 144. As discussed above, the processing circuit 56 may suitably provide the TTL logic circuitry acting as a signal generator to generate CONTROL signal.

The source 158 of MOSFET 144 is coupled to an I(−) Node 168. The I(−) Node 168 is coupled to the I(−) terminal 52 of the sensing resistor $R_{sense}$ 38, the I(−) terminal 44 of the current transformer 36, the second terminal 172 of the gate resistor $R_{gate}$ 152, and an I(−) output terminal 170 of the impedance circuit 140. A TTL logic level between CONTROL terminal 166 and I(−) terminal 170 switches MOSFET 144 to its ON or OFF states changing the equivalent resistance across the terminals 42, 44 of current transformer 36 and similarly changes the resistance across the OUT terminal 162 and I(−) terminal 170 of the impedance circuit 140.

When the CONTROL signal is equal to zero Volts dc ($V_{CONTROL}$=0 V), the MOSFET 144 is in its OFF state and acts like an open switch 142 in resistive branch 180. In particular, when the gate voltage is 0 V, gate 156 does not create a channel for current to flow between drain 154 and source 158 of MOSFET 144, thereby creating an open circuit through the drain resistor 150. Thus, the equivalent resistance seen across the terminals 42, 44 and across the OUT terminal 162 and I(−) terminal 170 of the impedance circuit 140) is the resistance of the sensing resistor ($R_{eq}$=$R_{sense}$). Additionally, when CONTROL signal is equal to zero Volts dc ($V_{CONTROL}$=0 V), the potential between the OUT terminal 162 and the I(−) terminal 170 ($V_{OUT}$) of the impedance circuit 140 is equal to the current generated by the current transformer 36 times the resistance of the sensing resistor $R_{sense}$ 38 ($V_{OUT}$=$I_{CT}$*$R_{sense}$).

When the CONTROL signal is equal to 5 volts ($V_{CONTROL}$=5 V), the MOSFET 144 acts like a closed switch. In particular, when the control voltage is 5 volts, the MOSFET 144 is turned ON permitting current to flow from drain to source, thereby providing a current path through the drain resistor $R_3$ 150 and the drain to source resistance $R_{Don}$ that is in parallel with the sensing resistor $R_{sense}$ 38. Thus, when MOSFET 144 is in its ON state, the terminals 42, 44 of the current transformer 36 and the OUT and the I(−) terminals 162, 170 of the impedance circuit 140 each see an equivalent resistance equal to the resistance of the sensing resistor $R_{sense}$ 38 in parallel with the sum of the drain resistor $R_3$ 152 and the drain to source resistance $R_{Don}$ in series ($R_{eq}$=$R_{sense}$||$R_3$+$R_{Don}$=$R_{sense}$*($R_3$+$R_{Don}$)/($R_{sense}$+$R_{Don}$)).

Additionally, when CONTROL signal is equal to five Volts dc (VCONTROL=5 V), the potential between OUT terminal 162 and I(−) terminal 170 of the impedance circuit 140 is equal to the current through the current transformer 36 times the equivalent resistance ($V_{OUT}$=$I_{secondary}$*$R_{sense}$||$R_3$+$R_{Don}$=$I_{secondary}$*$R_{sense}$*($R_3$+$R_{Don}$)/($R_{sense}$+$R_3$+$R_{Don}$)).

Illustratively, the A/D converter 41 (see FIG. 2) is connected across the OUT terminal 162 and the I(−) terminal 170 of the impedance circuit 140 and thus senses and samples $V_{OUT}$. The sampled $V_{OUT}$ constitutes the digital current measurement signal.

Referring again to FIG. 1, the processing circuit 56 receives the digital current measurement signal, and, together with digital voltage measurement signal, performs various metering calculations. The metering calculations may include watt-hour, VAR, or other calculations, which are known in the art. It is noted that processing circuit 56 must also adjust its metering calculations based on the state of the CONTROL signal. In particular, because the impedance circuit 140 provides two different input signal scaling ratios (from the two impedance levels), the calculations performed using the digital current waveforms must be adjusted accordingly. The processing circuit 56 may readily accomplish the adjustment, by way of example, by applying a normalizing scaling factor to the digital current signal values within the processing circuit 56 before they are used for metering calculations.

Preferably, the values of the resistance of the $R_{sense}$ 38 is much larger than the sum of the resistance of the drain resistor 150 and the drain to source resistance $(R_{sense} >> R_3 + R_{Don})$. This condition allows for significant scaling difference in the two impedance levels. In other words, if $R_{sense}$ is not much greater than the sum of $R_3 + R_{Don}$, then the effective boost during low current measurements will not be significant. Thus, if $R_{sense} >> R_3 + R_{Don}$ then the closing the circuit through $R_3 + R_{Don}$ will significantly lower the effect resistance to the output, thereby providing a significantly boost to $V_{OUT}$.

Additionally, it is preferable that the source to drain resistance of MOSFET 144 be much less than the resistance of drain resistor $R_3$ $(R_{Don} << R_3)$. Moreover, if the values of resistance of the sensing resistor $R_{sense}$ 38 and the drain resistor $R_3$ 150 track within approximately 0.05%, then single point calibration of the impedance circuit 140 is facilitated. In other words, if these resistors 38 and 150 have non-tracking errors, a separate calibration operation must be performed to compensate for each error. However, if the resistors have similar errors (i.e. that track to within approximately 0.05%), then only a single calibration is needed for the entire impedance circuit 140. To this end, as will be discussed below, the various elements of FIG. 3 may be formed on a single semiconductor substrate, which inherently causes the resistances to track closely to each other.

It is preferable that the temperature coefficients of the sensing resistor $R_{sense}$ 38 and the drain resistor $R_3$ 150 fall within ±50 ppm/° C. Illustratively, sensing resistor $(R_{sense})$ 38 is a 33 ohm with a 1% resistance tolerance and a ±50 ppm/° C. temperature coefficient of resistance. Gate resistor $(R_{gate})$ 152 has a resistance greater than or equal to 47 Kohms with a 10% resistance tolerance and a ±200 ppm/° C. temperature coefficient of resistance. Drain resistor $(R_3)$ is a 3 ohm with a 1% resistance tolerance and a ±50 ppm/° C. The temperature coefficients of $R_{sense}$ and $R_3$ are preferably selected such that the difference between the temperature coefficients is less than ±0.05%.

In the impedance circuit 140, when switch 142 is in the OFF state and open, i.e CONTROL=0 $V_{dc}$, then $V_{OUTOFF} = I_{CT}*33$. When switch 142 is ON and closed, i.e. CONTROL=5 $V_{dc}$, $V_{OUTON} = I_{CT}*2.75$.

Figure 4:
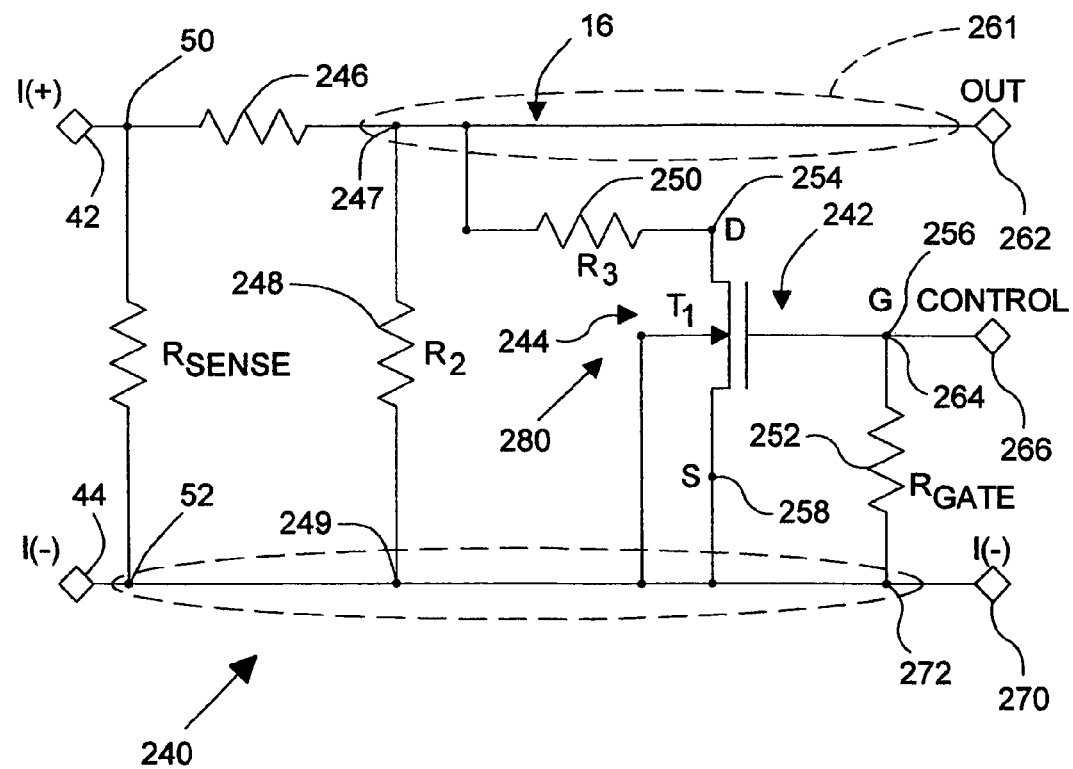
FIG. 4 is a schematic diagram of the sensing resistor and a second embodiment of the sensing impedance circuit of FIG. 2.

As discussed above, it is desirable that $R_{sense} > R_3 + R_{Don}$ in the impedance circuit 140 to achieve a significant boost when the current being measured is relatively low. This condition requires, in turn, that the effective resistance through the MOSFET 144, $R_{Don}$, be relatively small. FIG. 4 shows a second embodiment of the impedance circuit 40 that does not require a MOSFET that has as low an $R_{Don}$ value. As a consequence, the embodiment of FIG. 4 may more cost effective because it requires a MOSFET that is relatively less expensive to obtain.

This second embodiment 240 of the impedance circuit 40 for a current sensor 16 in accordance with the disclosure is shown, for example, in FIG. 4. To the extent that the impedance circuit 240 is similar to the impedance circuit 140, like parts will be referred to using like reference numerals.

The impedance circuit 240 includes a switch 242, a first voltage dividing resistor $R_1$ 246, a second voltage dividing resistor $R_2$ 248, a drain resistor $R_3$ 250, and a gate resistor $R_{gate}$ 252. As with the embodiment of FIG. 3, the switch 242 is MOSFET 244. The MOSFET 244 may suitably have a higher drain to source resistance $(R_{Don})$ value than MOSFET 144 used in the impedance circuit 140. In any event, the MOSFET 244 in the embodiment described herein has a drain to source resistance when on $(R_{Don})$ of less than 10 Ohms $(R_{Don} < 10\ \Omega)$ at 10 milliamps (10 $mA_{rms}$).

The drain 254 of MOSFET 244 is coupled through the drain resistor $R_3$ 250 to a voltage division node 261. The voltage division node 261 is coupled through the first voltage divider resistor $R_1$ 246 to the I(+) terminal 50 of the sensing resistor $R_{sense}$ 38 and the I(+) terminal 42 of the current transformer 36. One terminal 247 of the second voltage divider resistor $R_2$ 248 is coupled to the voltage division node 261. The voltage division node 261 is also coupled to an OUT terminal 262 of the impedance circuit 240.

The gate 256 of the MOSFET 244 is coupled to one terminal 264 of the gate resistor $R_{gate}$ 252 and to a CONTROL terminal 266 of the impedance circuit 240. The CONTROL terminal 266 is substantially identical in operation and function as the CONTROL terminal 166 of the impedance circuit 140 of FIG. 3, and is similarly connected to a source of control signals.

The source 258 of the MOSFET 244 is coupled to an I(−) Node 268. The I(−) Node 268 is coupled to the I(−) terminal 52 of the sensing resistor $R_{sense}$ 38, the I(−) terminal 44 of the current transformer 36, the second terminal 249 of the second voltage divider resistor $R_2$ 248 and the I(−) output terminal 270 of the impedance circuit 240. A TTL logic level between the CONTROL terminal 266 and the I(−) terminal 270 switches the MOSFET 244 transistor to its ON or OFF states changing the equivalent resistance. This change in equivalent resistance affects the resistance seen across the terminals 42, 44 of the current transformer as well as the equivalent resistance across the Out terminal 262 and the I(−) terminal 270 of the impedance circuit 240.

When the CONTROL signal is equal to zero Volts dc $(V_{CONTROL} = 0\ V)$, the MOSFET 244 is in its OFF state and acts like an open switch 242. The open which 242 creates an open circuit which removes the drain resistor $R_3$ 250 and $R_{Don}$ from the equivalent resistance calculation. Thus, the equivalent resistance seen across the terminals 42, 44 of current transformer 36 $R_{eqtrans}$ is the resistance of the sensing resistor $R_{sense}$ 38 in parallel with the in series voltage division resistors, $R_1$ 246 and $R_2$ 248, $(R_{eqtrans} = R_{sense} \| R_1 + R_2 = R_{sense}*(R_1+R_2)/(R_{sense}+R_1+R_2))$.
(While this is the complete expression, in this application R1+R2>>Rsense, making the parallel equal to Rsense.

When switch 242 is open, the equivalent resistance seen across the OUT and the I(−) terminals, 262 and 270, respectively, of the impedance circuit 240 is the resistance of the sensing resistor $R_{sense}$ 38 in parallel with the resistors of the voltage divider times the voltage division rule ($R_{eqOFF}$= ($R_{sense}$||($R_1$+$R_2$))*($R_2$/($R_1$+$R_2$))=($R_{sense}$*$R_2$)/($R_{sense}$+$R_2$)), when ($R_1$+$R_2$)>>$R_{sense}$. Additionally, when CONTROL signal is equal to zero Volts dc ($V_{CONTROL}$=0 V), the potential between OUT terminal 262 and I(−) terminal 270 ($V_{OUT}$) Of the impedance circuit 240 is equal to the current through the secondary times the equivalent resistance $R_{eqOFF}$ ($V_{OUT}$= ($I_{secondary}$*$R_{sense}$*$R_2$)/($R_{sense}$+$R_1$+$R_2$)). When (R1+R2)>> Rsense, then Vout=Isecondary*Rsense*R2/(R1+R)).

By contrast, when the CONTROL signal is equal to 5 volts ($V_{CONTROL}$=5 V), the MOSFET 244 is turned ON and acts as a closed switch which closes the circuit through the resistor $R_3$ 250 and the drain to source resistance, $R_{Don}$, of the MOSFET 244. When the MOSFET 244 is in the ON state, current flows from the drain 254 to the source 258 of the MOSFET 244 placing the drain resistor $R_3$ 250 and the drain to source resistance $R_{Don}$ in parallel with second voltage division resistor $R_2$. Thus, when the MOSFET 244 is ON, the equivalent resistance seen across OUT terminal 262 and I(−) terminal 270 of sensing impedance circuit 240 is equal to the equivalent resistance with the MOSFET 244 OFF in parallel with the drain resistor $R_3$ 250 and the drain to source resistance $R_{Don}$ in series ($R_{eqON}$= $R_{eqOFF}$||$R_3$+$R_{Don}$).

Additionally, when the CONTROL signal is equal to five Volts dc ($V_{CONTROL}$=5 V), the potential between OUT terminal 262 and I(−) terminal 270 of the impedance circuit 240 is equal to the current through the current transformer 36 times the equivalent resistance with MOSFET ON ($V_{OUT}$=$I_{secondary}$*$R_{eqON}$||($R_3$+$R_{Don}$)=$I_{secondary}$*$R_{sense}$*(($R_2$) ||($R_3$+$R_{Don}$))/(($R_2$||($R_3$+$R_{Don}$))+$R_1$)

Preferably, the values of the resistance of second voltage divider resistor $R_2$ 248 is much larger than the sum of the resistance of drain resistor $R_3$ 250 and the drain to source resistance of the MOSFET 244 ($R_2$>>$R_3$+$R_{Don}$). Additionally, it is preferable that the drain to source resistance of the MOSFET 244 is much less than the resistance of the drain resistor $R_3$ 250 ($R_{Don}$<$R_3$). If the values of resistance of the sensing resistor $R_{sense}$ 38, the first voltage divider resistor $R_1$ 246, the second voltage divider resistor $R_2$ 248 and the drain resistor $R_3$ 250 track within approximately ±0.05%, single point calibration of the impedance circuit 240 is facilitated. Again, such tracking may be readily accomplished if those elements are all formed on a single semiconductor substrate.

It is preferable that the temperature coefficients of the sensing resistor $R_{sense}$ 38, first voltage divider resistor $R_1$ 246, second voltage divider resistor $R_2$ 248 and drain resistor $R_3$ 250 fall within ±50 ppm/° C.

Illustratively, sensing resistor ($R_{sense}$) is a 33 ohm resistor with 1% resistance tolerance and a ±50 ppm/° C. temperature coefficient of resistance. The gate resistor $R_{gate}$ 252 has a resistance greater than or equal to 47 Kohms with a ±10% resistance tolerance and a 200 ppm/° C. temperature coefficient of resistance. The first voltage divider resistor $R_1$ 246 is a 1 Kohm resistor with a ±1% resistance tolerance and ±50 ppm/° C. temperature coefficient of resistance. The second voltage divider resistor $R_2$ 248 is a 1 Kohm resistor with a ±1% resistance tolerance and ±50 ppm/° C. temperature coefficient of resistance. The drain resistor $R_3$ 250 is a 10 ohm resistor with a 1% resistance tolerance and ±50 ppm/° C. temperature coefficient of resistance. The temperature coefficients of resistance of the sensing resistor $R_{sense}$ 38, the first voltage divider resistor $R_1$ 246, the second voltage divider resistor $R_2$ 248 and the drain resistor $R_3$ 250 are preferably selected such that the difference between the temperature coefficients of resistance is less than 0.05%.

As discussed above, it is preferable that each impedance circuit 140, 240 be implemented on a single silicon integrated circuit. Moreover, because three current sensors are required for a three phase electricity meter, it may be preferable to include three of such impedance circuits on a single semiconductor substrate to achieve further economies.

Figure 5:
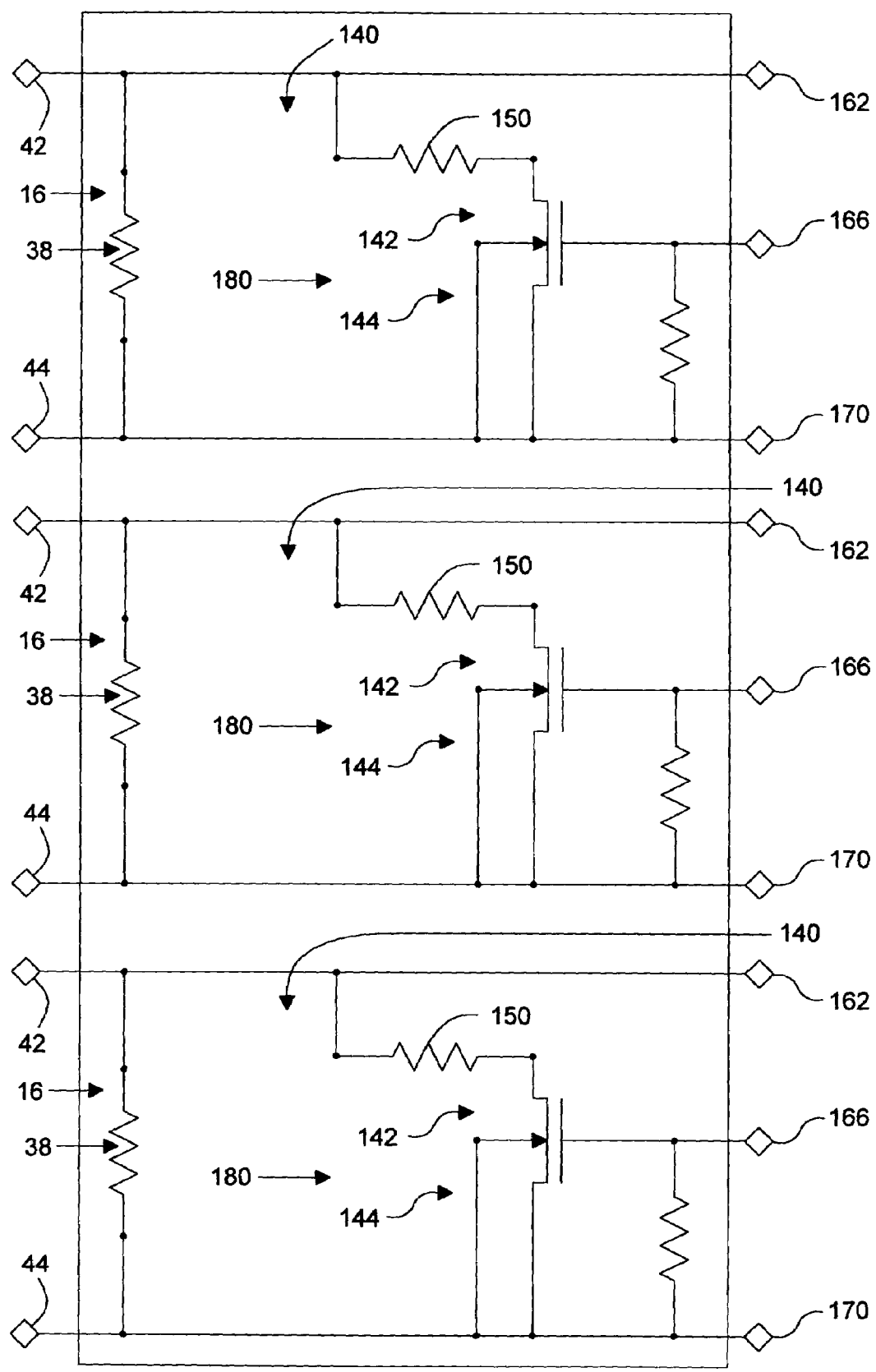
FIG. 5 is a diagrammatic view of an integrated circuit having three sensing impedance circuits of the type shown in FIG. 3 implemented thereon.

As shown, for example, in FIG. 5, three impedance circuits 140 associated with three current sensors 16 are incorporated into a single silicon chip 90. When the various resistors of each of the impedance circuits 140 are implemented on a single IC 90, a uniform variance is exhibited across the various resistors $R_{sense}$, $R_3$ and $R_{gate}$. This provides reduced complexity in calibrating the meter for errors introduced by the current sensor.

Figure 6:
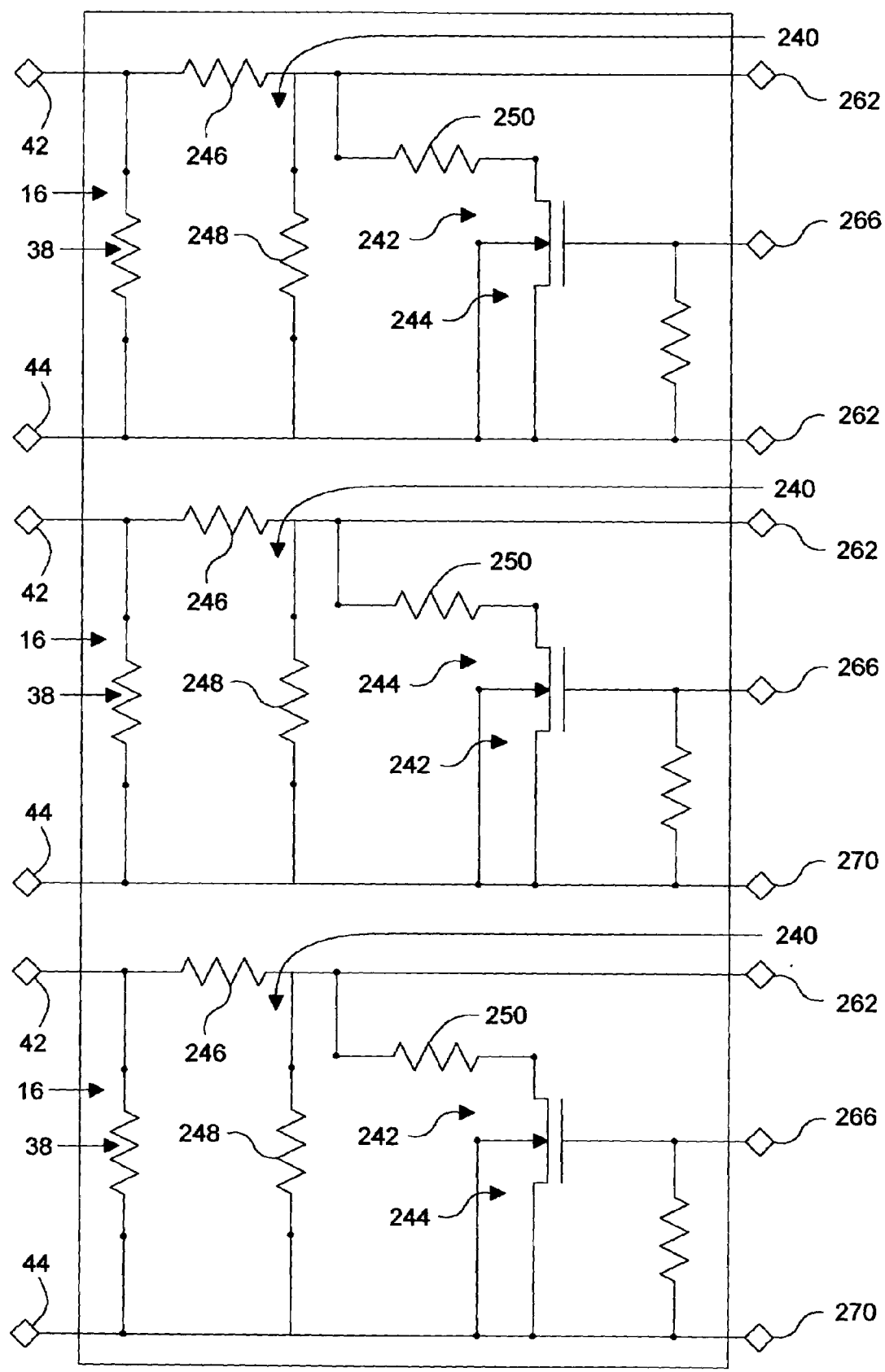
FIG. 6 is a diagrammatic view of an integrated circuit having three sensing impedance circuits of the type shown in FIG. 4 implemented thereon; and, FIG. 7 is a flow chart showing a control scheme implemented by a microprocessor to provide a control signal to a sensing impedance circuit according to the invention.

Similarly, FIG. 6 shows three impedance circuits 240 incorporated into a single silicon chip 90 for use in the meter 10, which meters a three-phase service 22. When the impedance circuits 240 are implemented on a single IC 90, a uniform variance is exhibited across the various resistors $R_{sense}$, $R_1$, $R_2$, $R_3$ and $R_{gate}$.

As discussed above, in the exemplary embodiment described herein, the processing circuit 56 provides the control signal (CONTROL) to the various embodiments of the impedance circuit 40, 140, 240. To this end, the processing circuit 56 of the electricity meter 10 includes an output port on which a TTL logic high (5 $V_{dc}$) or low (0 $V_{dc}$) may be present. The processing circuit 56 is configured so that the signal present on output is dependent upon a software implemented time filter and hysteresis program. The program receives the current measurements sensed from the current sensors and starts with low impedance, i.e. the output of the CONTROL signal port is 5 $V_{dc}$. If low current is sensed for several line cycles, the output of the control signal port is switched to TTL logic low 0 Vdc. This causes the MOSFET to switch off so that a larger resistance is seen across OUT terminal 62 and I(−) terminal 70 of sensing impedance circuit 40 resulting in a larger $V_{OUT}$ across those terminals. This facilitates provides higher resolution when the average current is relatively low in magnitude. The same general algorithm is implemented to switch MOSFET 44 ON after several line cycles showing higher current.

Figure 7:
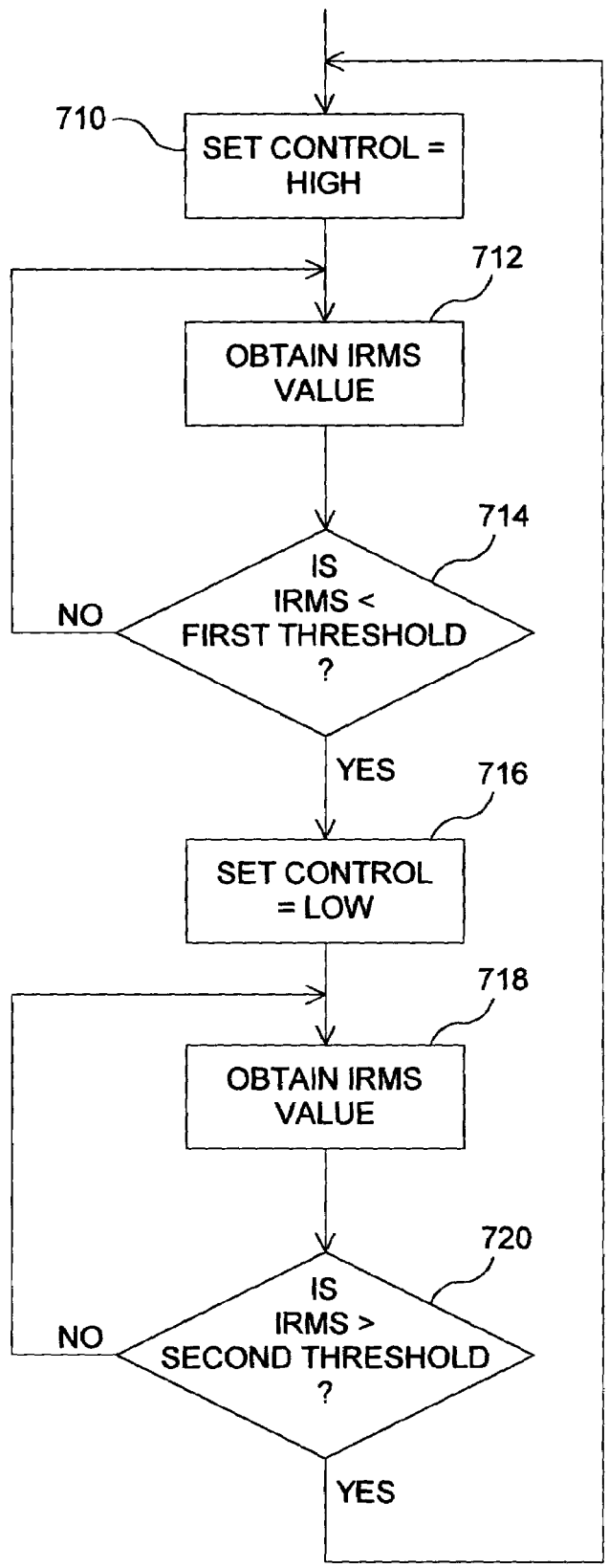

FIG. 7 shows an exemplary flow diagram of the operations of the processing circuit 56 (or any control device) that are relevant to generating the control signal. It is noted that the processing circuit 56 may contemporaneously perform several other metering functions, not discussed herein, but which would be known to those of ordinary skill in the art.

In step 710 the processing circuit 56 generates a high output signal as the CONTROL signal. Thereafter, in step 712, the processing circuit 56 periodically obtains a IRMS value representative of RMS current level on the relevant phase of the power line. To this end, the processing circuit 56 accumulates the digital current signal generated by the A/D converter 41 and uses scaling and RMS calculations to determine the IRMS value. Generally, samples covering several cycles of the digital current waveform should be used to calculate the IRMS value. A time filter is defined by the number of cycles worth of samples used in the IRMS calculation.

In step 714 the processing circuit 56 determines whether the IRMS value is below a first threshold. The first threshold represents the cut-off point at which the processing circuit 56 causes the impedance circuit 40, 140 or 240 to switch from the low impedance level (switch on) to the high impedance level (switch off). In the exemplary embodiment described herein, the first threshold is preferably between 10 amps RMS to 8 amps RMS in a class 200 amps RMS meter (although other threshold values might be used depending on the particular application) If the IRMS value is below the first threshold, then the processing circuit 56 proceeds to step 716. If not, then processing circuit 56 returns to step 712 to obtain a subsequent IRMS value.

In step 716, because the IRMS value indicated that the current being measured is low (low current requires high impedance or high signal gain), the processing circuit 56 changes the CONTROL signal to a low logic signal. This causes the switch of the impedance circuit 40, 140 or 240 to open, thereby changing to the high impedance level.

Thereafter, in step 718, the processing circuit 56 periodically obtains a subsequent IRMS value (i.e. a value representative of RMS current level on the relevant phase of the power line). Step 718 is substantially identical to step 712.

In step 720, the processing circuit 56 determines whether the IRMS value is above a second threshold. The second threshold represents the cut-off point at which the processing circuit 56 causes the impedance circuit 40, 140 or 240 to switch from the high impedance level back to the low impedance level. In the exemplary embodiment described herein, the second threshold is preferably higher than the first threshold, thereby providing some hysteresis. If the IRMS value is above the second threshold, then the processing circuit 56 returns to step 710 (i.e. change back to low impedance level). If not, then processing circuit 56 returns to step 718 to obtain a subsequent IRMS value.

While FIGS. 3 and 4 show impedance circuits implemented using discrete components and FIGS. 5 and 6 show impedance circuits implemented on a single IC, it is within the scope of the disclosure to use integrated resistors and a discrete MOSFET to implement impedance circuits. Integrated resistors have recently begun to demonstrate tolerances that are within the ranges preferred for implementation of the impedance circuits.

The impedance circuit 40 can be implemented in various embodiments, some of which are specifically disclosed herein. The sensing impedance circuits disclosed herein include passive elements that are selectively coupled and decoupled from a sensing resistor 38. While shown as being coupled in parallel to the sensing resistor 38, it is within the scope of the disclosure for the passive elements to be coupled in series with the sensing resistor to increase the resistance across which the current is measured. In such situation, a resistor may be placed in parallel with a switch so that when the switch is open, the current flows through the resistor and when the switch is closed, the resistor is effectively shorted out.

While shown as being implemented in an electricity meter for a three phase service, it is within the scope of the disclosure for the impedance circuit 40 to be utilized with a single phase, dual phase or any poly-phase service and a meter therefore.

Although the invention has been described in detail with reference to certain preferred embodiments, variations and modifications exist within the scope and spirit of the invention as described and defined in the following claims.

What is claimed is:

1. An impedance circuit for an electrical meter monitoring power usage from a service line, the meter having a current meter and a transformer having a conductor of the service line coupled to primary terminals and a sensing resistor coupled across secondary terminals, the impedance circuit comprising:
   a signal generator generating a control signal having a level dependent upon the current sensed by the current meter;
   an electrically controlled switch having an ON state and an OFF state, the state of said switch being dependent upon the level of the control signal;
   a resistive branch including the electrically controlled switch and a resistive element;
   wherein the impedance circuit couples the sensing resistor to the current meter and wherein the equivalent resistance seen by the current meter is dependent upon the state of the switch.

2. The impedance circuit of claim 1 wherein the switch is a transistor.

3. The impedance circuit of claim 1 wherein the resistive branch includes a resistor with a temperature coefficient within 0.05% of the temperature coefficient of the sensing resistor.

4. The impedance circuit of claim 1 wherein the resistive branch is in parallel with the sensing resistor when the switch is in the ON state.

5. The impedance circuit of claim 1 and further comprising a plurality of resistors in series constituting a voltage divider in parallel with the sensing resistor and the current meter is coupled across terminals of one resistor of the voltage divider.

6. The impedance circuit of claim 5 wherein the resistive branch is in parallel with the one resistor of the voltage divider.

7. The impedance circuit of claim 1 wherein the sensing resistor, the electrically controlled switch and the resistive element are all formed on a single semiconductor substrate.

8. The impedance circuit of claim 7 wherein the switch comprises a MOSFET transistor.

9. The impedance circuit of claim 2 wherein the transistor is a MOSFET transistor.

10. The impedance circuit of claim 9 wherein the resistive element is connected to a drain of the MOSFET transistor.

11. The impedance circuit of claim 1 wherein a gate resistor is connected to a drain of the MOSFET transistor.

12. The impedance circuit of claim 1 wherein the impedance circuit is a passive impedance circuit.

13. The impedance circuit of claim 1 wherein the level of the control signal causes the electrically controlled switch to have the OFF state when the current sensed by the current meter is below a first threshold.

14. The impedance circuit of claim 13 wherein the level of the control signal causes the electrically controlled switch to have the ON state when the current sensed by the current meter exceeds a second threshold.

15. The impedance circuit of claim 14 wherein the first threshold is different from the second threshold.

* * * * *